United States Patent [19]

Konno

[11] Patent Number: 5,545,498

[45] Date of Patent: *Aug. 13, 1996

[54] METHOD OF PRODUCING SEMICONDUCTOR DEVICE AND PHOTOMASK THEREFOR

[75] Inventor: Tsugimi Konno, Nagano-ken, Japan

[73] Assignee: Seiko Epson Corporation, Tokyo, Japan

[*] Notice: The term of this patent shall not extend beyond the expiration date of Pat. No. 5,403,681.

[21] Appl. No.: 380,060

[22] Filed: Jan. 30, 1995

Related U.S. Application Data

[63] Continuation-in-part of Ser. No. 730,698, Jul. 16, 1991, Pat. No. 5,403,681.

[30] Foreign Application Priority Data

| Jul. 26, 1990 | [JP] | Japan | 2-198818 |
| Aug. 7, 1990 | [JP] | Japan | 2-208937 |
| Nov. 29, 1990 | [JP] | Japan | 2-331696 |
| Jun. 13, 1991 | [JP] | Japan | 3-141774 |

[51] Int. Cl.⁶ .................................................. G03F 9/00
[52] U.S. Cl. .................. 430/18; 430/5; 430/311; 430/319; 437/51; 437/80; 437/928
[58] Field of Search ................. 430/18, 5, 311, 430/319; 437/51, 80, 928

[56] References Cited

U.S. PATENT DOCUMENTS

| 4,710,440 | 12/1987 | Del Priore | 430/5 |
| 4,881,257 | 11/1989 | Nakagawa | 430/5 |
| 5,403,681 | 4/1995 | Konno | 430/5 |

*Primary Examiner*—Mark Chapman
*Attorney, Agent, or Firm*—Ladas & Parry

[57] ABSTRACT

In a wafer process of a semiconductor device, disclosed are photomasks and a semiconductor device producing method. In forming a plurality of semiconductor chips on a semiconductor substrate by using a plurality of photomasks, at least one photomask 10 having an effective chip arrangement composed of a grid-like pattern 80 which does not form chips incomplete in appearance and/or in function in an outer circumferential range of a wafer 3 is used in the exposure step.

9 Claims, 4 Drawing Sheets

FIG. I
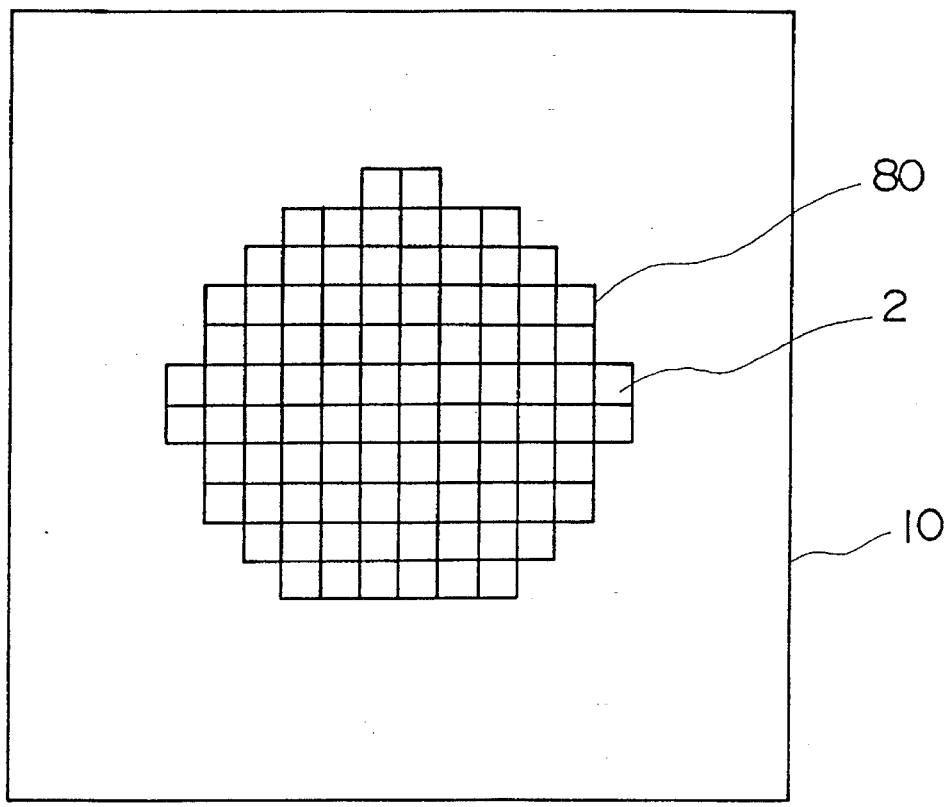
FIG. 2
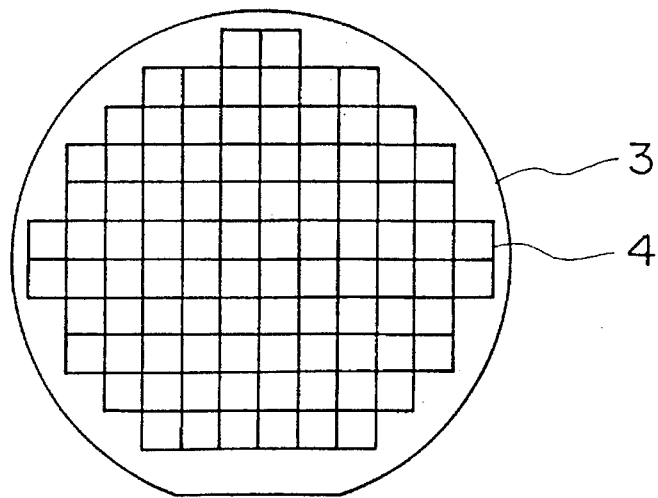

5,545,498

1

METHOD OF PRODUCING SEMICONDUCTOR DEVICE AND PHOTOMASK THEREFOR

This is a continuation-in-part of application Ser. No. 07/730,698 filed on Jul. 16, 1991, now U.S. Pat. No. 5,403,681.

BACKGROUND OF THE INVENTION

1. Field of the Invention

The present invention relates to a method of producing semiconductor devices and photomasks therefor, and particularly relates to a method of arrangement of effective chips through shadow printing by means of a photomask or through projection printing by means of a reticle according to the photolithographic technique in a semiconductor device producing method, and photomasks for use in the process of this producing method.

2. Description of the Prior Art

In the process of producing a semiconductor device such as an integrated circuit or the like, conventionally, transfer printing for forming a mask pattern on a semiconductor wafer (hereinafter simply called "a wafer") is an important step as one of photolithographic techniques. As well known, to attain the transfer printing there are two ways, one being shadow printing in which shadowgram projection is formed on a wafer by use of a mask pattern, the other being projection exposure in which an optical system such as a refractive-system lens, a reflective-system spherical mirror, or the like, is interposed between a mask and a wafer. A mask used for the projection exposure in which a refractive-system lens is disposed is called a reticle.

That is, it is shadow printing in which a mask pattern is directly printed on a resist film on a wafer without interposing any optical system between a mask and a wafer. Further, at present, in projection printing, a stepper system of reduced projection transfer is in a main current. The exposure of this system is called stepper exposure. A reticle pattern which is ten times or five times as large as an original pattern is imaged as a chip pattern through a refractive-system reducing lens, and the image is projected on the whole of a wafer through step-and-repeat. An apparatus for performing stepper exposure and the operation thereof are already well known, and therefore the description about them will be omitted here.

First, in or upon completion of the process of the conventional shadow printing using a photomask or projection printing using a reflection-system spherical mirror, chips are arranged on a wafer in such a manner as shown in FIG. 4. That is, normal semiconductor chips 4 each having a desired shape are formed in the most part on the surface of a wafer 3, while semiconductor chips 5 incomplete in appearance as well as in function are formed in a range in the vicinity of an outer circumference of the wafer 3 through the shadowgram of a mask pattern of a photomask (which will be described later). This depends on the desire to use the effective range on the wafer 3 to the maximum.

In this case, the size of the arrangement of the whole of a plurality of chips to be used over a photomask is larger than the diameter of the wafer 3 in FIG. 4 as can be seen by a photomask 1 shown in FIG. 5, so that the chip arrangement is made to have a chip pattern which extends to the outer circumferential range of the wafer 3. This arrangement is used because of simplicity in data processing in producing the photomask 1 including mask patterns 2.

2

Next, in the producing process through the conventional projection exposure using a refractive-system lens in which a reticle is used, as shown in FIG. 6, an enlarged collective pattern 7, for example, five-times enlarged collective pattern, formed on a reticle 6 is constituted by, for example, four enlarged mask patterns 20. When ordinary stepper exposure is carried out by use of this reticle 6, a mixture pattern in which complete semiconductor chips 4 and incomplete semiconductor chips 5 are mixed is provided on a wafer 3 similarly to the case shown in FIG. 4.

Further, as being apparent from the description of the conventional integrated circuit producing methods in reference to FIGS. 4 through 6, the conventionally used photomask 1 has a pattern which is formed so that the range of the outer periphery of a generally rectangular grid-like pattern 8 having the arrangement of the mask patterns 2 is larger than the outer circumference of the wafer 3 shown in FIG. 4.

Of the incomplete semiconductor chips 5 described above, those having an incomplete appearance as shown in FIG. 7 are detected in an appearance inspection as having insufficient optical reflection, for example, by using an optical microscope or a stereomicroscope, because a chip pattern is printed on a chamfer portion 9 on the wafer 3 as shown by arrows B in FIG. 8. Such an incomplete chip has an appearance of an incomplete a rectangle which has a little cut-away portion in comparison with a regular rectangle so that the appearance is not so good but it has no functional defect as a semiconductor chip. Further, a chip which is incomplete in function has a large cut away portion in comparison with a regular rectangle, so that it has a large defect in function as well as in appearance.

In the conventional semiconductor device producing method as described above and in the photomask to be used in such a method, semiconductor chips formed in the outer circumferential range of a wafer (a semiconductor substrate) include numbers of chips which are incomplete in appearance and/or in function. Accordingly, there have been causes of increase in cost due to increase in the number of steps of selecting chips which are incomplete in appearance and due to prolongation of time taken for the test for removing chips which are incomplete in function.

SUMMARY OF THE INVENTION

It is therefore an object of the present invention to solve the problems described above.

It is another object of the present invention to provide a semiconductor-device producing method in which the number of steps of selecting chips which are incomplete in appearance can be reduced and the time taken for the test for removing chips which are incomplete in function can be shortened so that the cost can be reduced.

It is a further object of the present invention is to provide a photomask to be used in the semiconductor-device producing method accordingly to the present invention.

In the first semiconductor device producing method in which exposure is carried out by us:trig a photomask in a predetermined step to thereby form a semiconductor collective pattern on a semiconductor wafer, according to the present invention, exposing and printing are performed by using at least one photomask having a chip pattern formed on the photomask only in an effective chip range except an incomplete chip range which is formed through crossing of a part of the chip range of the chip pattern with a circumference of the semiconductor wafer when exposure is made onto the semiconductor chips.

The photomask for use in an exposure step using a photomask in a process of producing an integrated circuit, according to the present invention, comprises: a mask pattern for semiconductor chips corresponding to an effective chip range except an incomplete chip range which is formed through crossing of a part of a semiconductor chip pattern formed on the photomask with a circumference of a semiconductor wafer through exposure.

In the second semiconductor device producing method in which exposure is performed by using a reticle in a predetermined step to thereby form a semiconductor collective pattern on a semiconductor wafer, according to the present invention, stepper exposure is carried out performed only in an effective range of the semiconductor wafer except an incomplete chip range which is formed through crossing of a part of a chip range of an enlarged chip pattern formed in the reticle with a circumference of the semiconductor wafer through the stepper exposure onto the semiconductor wafer.

According to the present invention, first, in the exposing step by use of a photomask, shadow printing is carried out by use of at least one photomask having only a mask pattern composed of effective chips except an incomplete chip range which is formed through crossing of a part of the semiconductor chip pattern formed on the photomask with a circumference of the wafer through exposure. Accordingly, it is possible to obtain an arrangement of only effective chips without forming chips incomplete in appearance and/or in function in the outer circumferential range of the wafer.

Further, even if only one predetermined photomask is used in the whole producing process, and even if the other photomasks used are conventional ones, finally obtained semiconductor chips in the outer circumference of the wafer become incomplete in function, so that the incomplete semiconductor chips can be electrically distinguished.

Further, in the process of producing semiconductor chips by use of a reticle, exposure is carried out so as to eliminate an incomplete chip range which is formed by crossing of a part of the chip range of the enlarged pattern formed on the reticle with a circumference of the wafer through the stepper exposure. Accordingly, it is possible to obtain an arrangement of only effective chips without forming any chips incomplete in appearance and/or in function similarly to the above case using a photomask.

BRIEF DESCRIPTION OF THE DRAWINGS

FIG. 1 is a plan view showing an example of a mask pattern of the photomask according to the present invention;

FIG. 2 is a plan view showing an effective chip arrangement on a wafer formed by use of the photomask of the embodiment of FIG. 1;

DETAILED DESCRIPTION OF THE PREFERRED EMBODIMENTS

Figure 3:
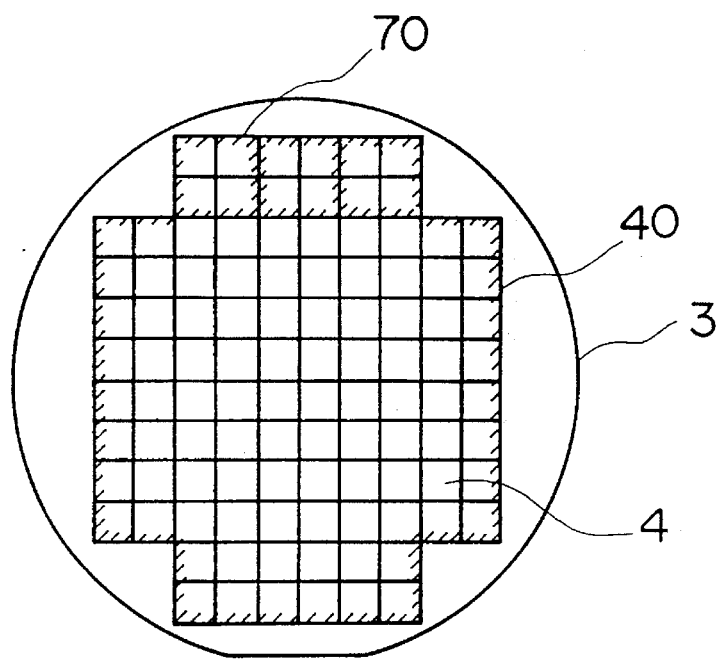
FIG. 3 is a plan view showing an effective chip arrangement obtained in a producing method using the reticle according to another embodiment of the present invention.

Referring to the drawings, embodiments of the present invention will be described hereunder.

Embodiment 1

Figure 4:
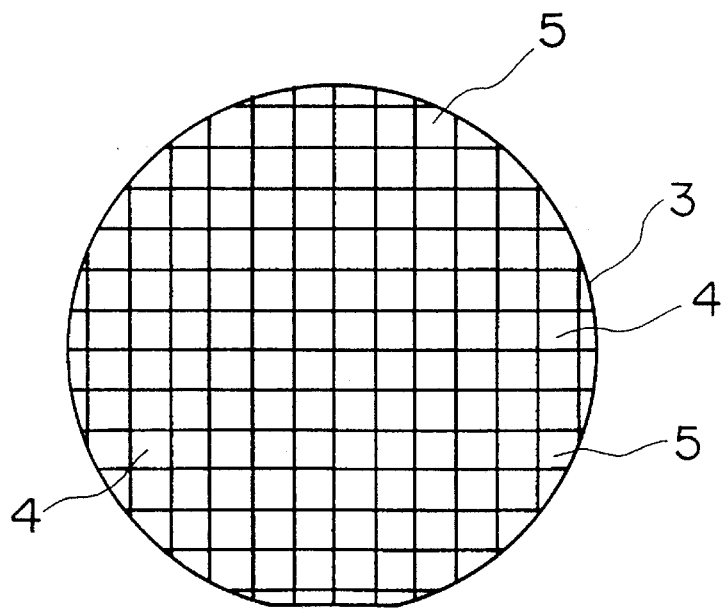
FIG. 4 is a plan view showing a chip arrangement on a wafer formed in a conventional producing method.
Figure 5:
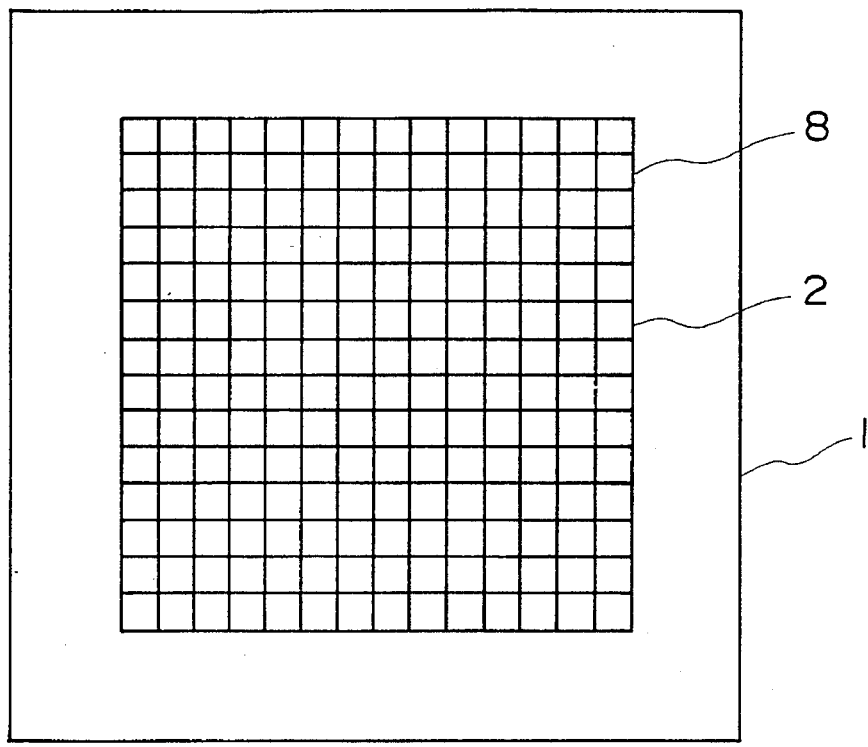
FIG. 5 is a plan view of a photomask having a conventional mask pattern.

FIG. 1 is a schematic plan view showing a mask pattern of a photomask used in an embodiment of the semiconductor device producing method according to the present invention. A photomask 10 shown in FIG. 1 is one of a plurality of photomasks used in the whole process of the producing method, and the chip arrangement in each of the other ones of the plurality of photomasks used (not shown) has a rectangular grid-like pattern similarly to the conventional photomask 1 shown in FIG. 5. The shape of a grid pattern 80 in FIG. 1 is formed in such a manner as shown in FIG. 1 so that there are not produced such incomplete semiconductor chips 5, for example, as shown in FIG. 4 which may be formed at cross portions of the circumference of a wafer 3 as shown in FIG. 4 and a part of a mask pattern 2 as shown in FIG. 5 when shadow printing is made on the wafer 3 by using a conventional photomask 1 as shown in FIG. 5.

FIG. 2 is a typical plan view showing the effective chip arrangement on the wafer 3 formed by use of the photomask 10 shown in the embodiment of FIG. 1. In FIG. 2, the distance between the outer circumference of the wafer 3 and an outer edge of the effective chip arrangement is kept at least 2 mm. Thus, by making the arrangement so that no effective chip is arranged in the outer circumferential range of the wafer 3 including the chamfer portions of the wafer 3, such incomplete semiconductor chips 5 as shown in FIG. 4 which are incomplete in appearance and/or in function are not formed.

After completion of the process of producing semiconductor chips 4 on the wafer 3 having such a configuration as described above, the electric characteristics and functions of each of the semiconductor chips 4 are measured, and marking is applied onto defective chips for the selection in the following steps. In the measurement of the electric characteristics and functions of the semiconductor chips 4, chips arranged in the outer circumferential portion of the wafer 3 are necessarily judged to be defective and marking is applied on such defective chips. That is, all the chips formed on the wafer 3 other than the chips on the chip arrangement on the photomask 10 shown in FIG. 1 are judged to be defective. As a result, such an effective chip arrangement of the semiconductor chips 2 as shown in FIG. 2 was produced on the wafer 3.

Thereafter, only the good chips except the marked defective chips are picked up, and then removal work for selection of the chips defective in appearance and faults in protection film is performed. In that time, however, the selection of the chips defective in appearance became unnecessary.

Further, also in the measurement of the electric characteristics and functions of each of the chips, it has become possible to eliminate some test items because no chips defective in function is included in the arrangement in the producing process. Accordingly, it was achieved to shorten the test time.

In this embodiment, if a well forming photomask or an electrode leading-out photo-mask is used as the photomask as shown in FIG. 1, it is possible to employ electrical judgement. Further, if a photomask for a gate electrode, a photomask for wiring, a photomask for wiring connection, or the like, is used as the photomask of FIG. 1, more preferably, it is possible to perform judgement through visual observation with eyes. In a case, for example, where a conventional aluminum wiring is formed on gate electrodes of semiconductor chips 4 using the photomask for wiring, a visual color off the aluminum wiring formed on a silicon wafer is quite distinctive from a base color off the silicon wafer and easy visual distinction of the effective chip arrangement is obtained.

Further, in this embodiment, the effect is shown more remarkably in a relatively small semiconductor chip having a short side of not larger than 5 mm.

Embodiment 2

In this embodiment, description will be made about the method of producing semiconductor chips similar to those of the embodiment 1 through exposure by use of the conventional reticle.

Figure 6:
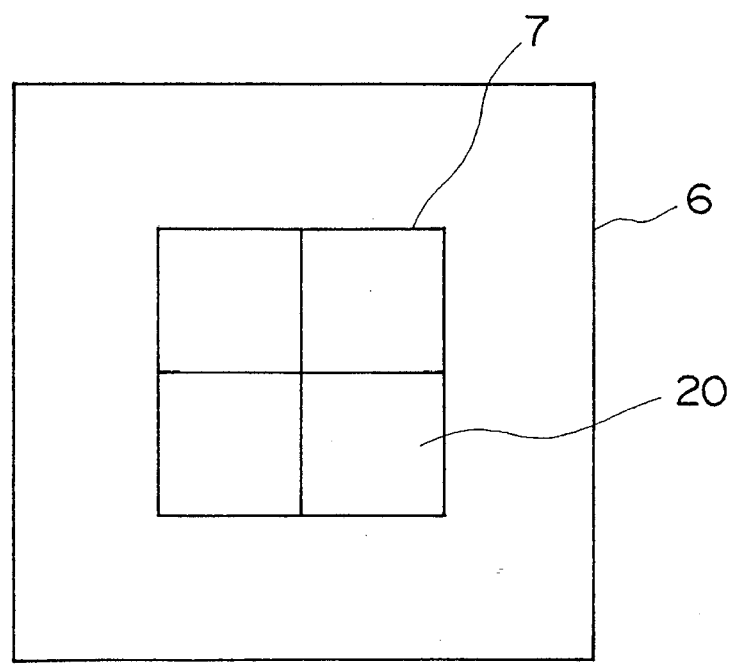
FIG. 6 is a plan view of a reticle having a conventional enlarged mask pattern.
Figure 7:
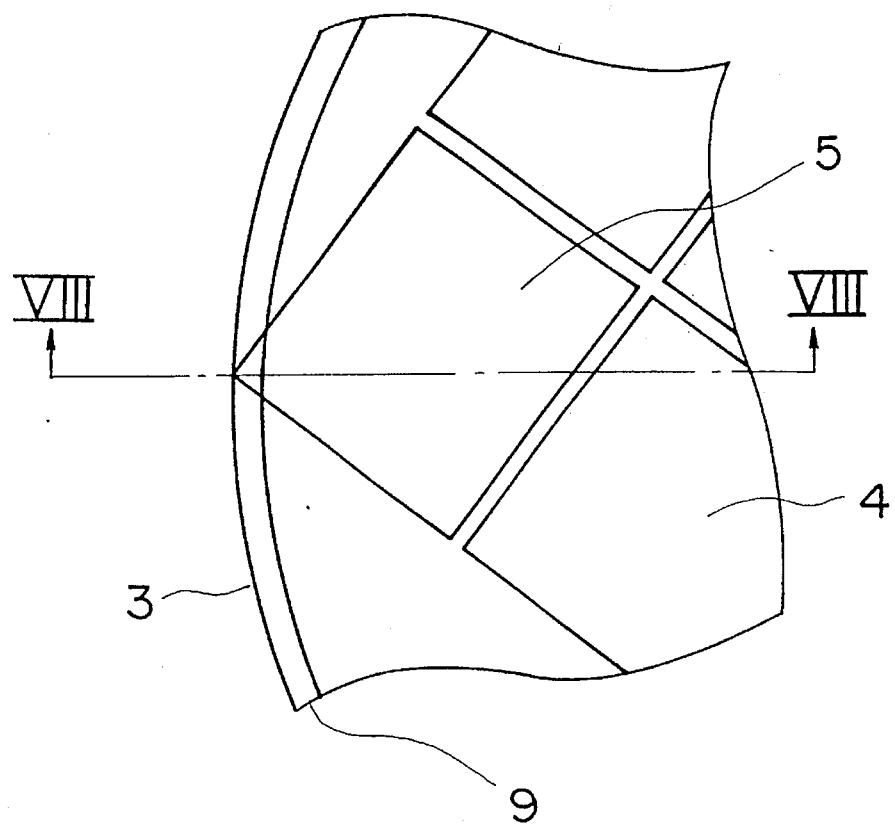
FIG. 7 is a schematic plan view of a chip which is incomplete in its circumference.
Figure 8:
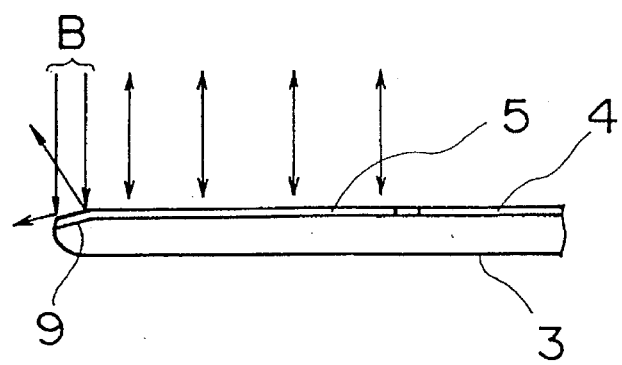
FIG. 8 is a sectional view taken on a line A—A.

FIG. 3 is a typical plan view showing a chip pattern on a wafer obtained in another embodiment of the semiconductor-device producing method according to the present invention. Although the final pattern was formed through various kinds of predetermined steps, the reticle 6 shown in the conventional example in FIG. 6 was used for projection printing.

Stepper exposure was performed with an enlarged collective pattern 7 of the reticle 6 as an exposure unit so that a collective chip pattern 40 was printed on a wafer 3. The reference numeral 70 designates a reduced collective pattern corresponding to the enlarged collective pattern 7. Each of the reduced collective patters 70 is of course composed of full-sized semiconductor chips 4.

In this producing method according to the present invention, since the projection printing is performed so that no part of the reduced collective patterns 70 crosses the circumference of the wafer 3, the collective chip pattern 40 is constituted only by effective chips, that is, semiconductor chips 4.

In such an exposing system, formation of such incomplete semiconductor chips 5 as produced in the conventional method (see FIG. 4) can be prevented, so that the collective chip pattern 40 constituted only by effective chips 4 can be formed on the wafer 3.

In this case, since projection printing can be performed by use of, for example, the enlarged collective pattern 7 for four chips as an exposure unit, there is an advantage that the method of formation can be simplified, while a dead space in which no semiconductor chip is formed is a little enlarged in the outer circumferential range of the wafer 3 unlike the case of the Embodiment 1. Further, in the process in which the reduced exposure must be performed, this formation system is particularly effective for achieving the objects of the present invention.

As described above, according to the present invention, in at least one of a plurality photomasks used for producing a semiconductor device, an effective chip arrangement is made on a wafer (semiconductor substrate) that no chip incomplete in appearance and/or in function is formed in the outer circumferential range of the wafer (a semiconductor substrate), and provided is a producing method in which the photomask having the above chip arrangement is used. Accordingly, it has become possible to reduce the number of the steps of selecting chips incomplete in appearance and to shorten the test time for removing chips incomplete in function. Accordingly, it has been achieved reduction in cost and improvement in quality.

Further, it has been made apparent that the semiconductor chip forming method can be applied also to the projection printing system using a reticle. Accordingly, in the semiconductor device producing method of this system, it is possible to obtain the effect similar to that obtained in the above case of using a photomask.

I claim:

1. A semiconductor wafer having semiconductor chip patterns on the entire extent of a surface bounded by a peripheral edge of said wafer, wherein said semiconductor chip patterns comprises a first array of a preselected number of complete semiconductor chip patterns on portions of said surface spaced from said wafer edge and a peripheral array of incomplete semiconductor chip patterns on portions of said surface overlying said wafer edge, and said first array and peripheral array are made by steps comprising exposures to radiation through a necessary number of photomasks to give a complete function to each of semiconductor chips formed in said first array, said photomasks comprising photomasks each having a pattern consisting of chip patterns for both said first array and peripheral array and one or more photomasks each having a pattern consisting of chip patterns for said first array and some or none of chip patterns for said peripheral array.

2. A semiconductor wafer according to claim 1, wherein a shorter side of each of said semiconductor chip patterns is not larger than 5 mm.

3. A semiconductor wafer according to claim 1, wherein a peripheral edge of said first array is spaced at least 2 mm from said wafer edge.

4. A semiconductor wafer having semiconductor chip patterns on the entire extent of a surface bounded by a peripheral edge of said wafer, wherein said semiconductor chip patterns comprises a first array of a preselected number of complete semiconductor chip patterns on portions of said surface spaced from said wafer edge and a peripheral array of incomplete semiconductor chip patterns on portions of said surface overlying said wafer edge, and said first array and peripheral array are made by steps comprising exposures to radiation through a necessary number of photomasks to give a complete function to each of semiconductor chips formed in said first array, said photomasks comprising photomasks each having a pattern consisting of chip patterns for both said first array and peripheral array and one or more photomasks for wiring process each having a pattern consisting of chip patterns only for said first array.

5. A semiconductor wafer according to claim 4, wherein a shorter side of each of said semiconductor patterns is not larger than 5 mm.

6. A semiconductor wafer according to claim 4, wherein said wiring process is for a gate electrode wiring.

7. A semiconductor wafer according to claim 4, wherein said wiring process is for an aluminum wiring.

8. A semiconductor wafer according to claim 4 wherein a peripheral edge of said first array is spaced at least 2 mm from said wafer edge.

9. A method of manufacturing a semiconductor wafer including process for forming semiconductor chip patterns on the entire extent of a surface bounded by a peripheral edge of said wafer, said semiconductor chip patterns comprising a first array of complete semiconductor chip patterns on portions of said surface spaced from said wafer edge and a peripheral array of incomplete semiconductor chip patterns on portions overlying said wafer edge, wherein said process comprises steps of exposures to radiation through a necessary number of photomasks to give a complete function to each of semiconductor chips formed in said first array, said photomasks comprising masks each having a pattern consisting of chip patterns for both said first array and peripheral array and one or more masks each having a pattern consisting of chip patterns for said first array and some or none of chip patterns for said peripheral array so that complete chip patterns are printed in said first array and incomplete chip patterns are printed in said peripheral array.

\* \* \* \* \*